US012640754B2

(12) United States Patent
Srinivasan et al.

(10) Patent No.: US 12,640,754 B2
(45) Date of Patent: May 26, 2026

(54) SYSTEM-LEVEL DATA COMPRESSION SCHEME

(71) Applicant: Xilinx, Inc., San Jose, CA (US)

(72) Inventors: Krishnan Srinivasan, San Jose, CA (US); Zhiye Song, San Jose, CA (US)

(73) Assignee: XILINX, INC., San Jose, CA (US)

( * ) Notice: Subject to any disclaimer, the term of this patent is extended or adjusted under 35 U.S.C. 154(b) by 76 days.

(21) Appl. No.: 18/594,783

(22) Filed: Mar. 4, 2024

(65) Prior Publication Data

US 2025/0279792 A1 Sep. 4, 2025

(51) Int. Cl.
| | |
|---|---|
| *H03M 7/00* | (2006.01) |
| *H03M 7/30* | (2006.01) |
| *H03M 7/46* | (2006.01) |

(52) U.S. Cl.
CPC .......... *H03M 7/6082* (2013.01); *H03M 7/46* (2013.01); *H03M 7/6005* (2013.01); *H03M 7/6011* (2013.01)

(58) Field of Classification Search
CPC .... H03M 7/6082; H03M 7/46; H03M 7/6005; H03M 7/6011
USPC ...................................................... 341/50, 51
See application file for complete search history.

(56) References Cited

U.S. PATENT DOCUMENTS

| | | | | |
|---|---|---|---|---|
| 6,501,397 B1 * | 12/2002 | Radha | .................... | H04N 19/12 |
| | | | | 375/E7.184 |
| 10,331,506 B1 * | 6/2019 | Chickermane | .......... | G06F 11/30 |
| 2020/0228148 A1 * | 7/2020 | Thomas | .............. | H03M 7/6023 |
| 2020/0401414 A1 * | 12/2020 | Ware | .................... | G06F 9/30079 |
| 2021/0159913 A1 * | 5/2021 | Patel | .................... | H03M 7/3084 |
| 2022/0360803 A1 * | 11/2022 | Kuusela | ................ | H04N 19/44 |
| 2023/0297810 A1 * | 9/2023 | Khinvasara | ........... | G06N 3/088 |
| | | | | 706/16 |
| 2023/0334707 A1 * | 10/2023 | Smith-Lacey | ...... | H03M 7/3064 |
| 2023/0370392 A1 * | 11/2023 | Srinivasan | ........... | H04L 49/109 |

* cited by examiner

*Primary Examiner* — Jean B Jeanglaude
(74) *Attorney, Agent, or Firm* — Slater Matsil, LLP

(57) ABSTRACT

An implementation includes an integrated circuit, a network-on-chip (NoC) a plurality of first circuits, each first circuit may include a compressor and a decompressor, the compressor being configured to compress datastreams, and the decompressor being configured to decompress the compressed datastreams, the compressed datastreams may include symbols, the decompressor may include a plurality of symbol decoders configured to decode in parallel the compressed datastreams. The integrated circuit also includes a memory circuit. The circuit also includes a plurality of switches, the plurality of switches being interconnected and communicatively linking the plurality of first circuits with the memory circuit.

20 Claims, 11 Drawing Sheets

100

102

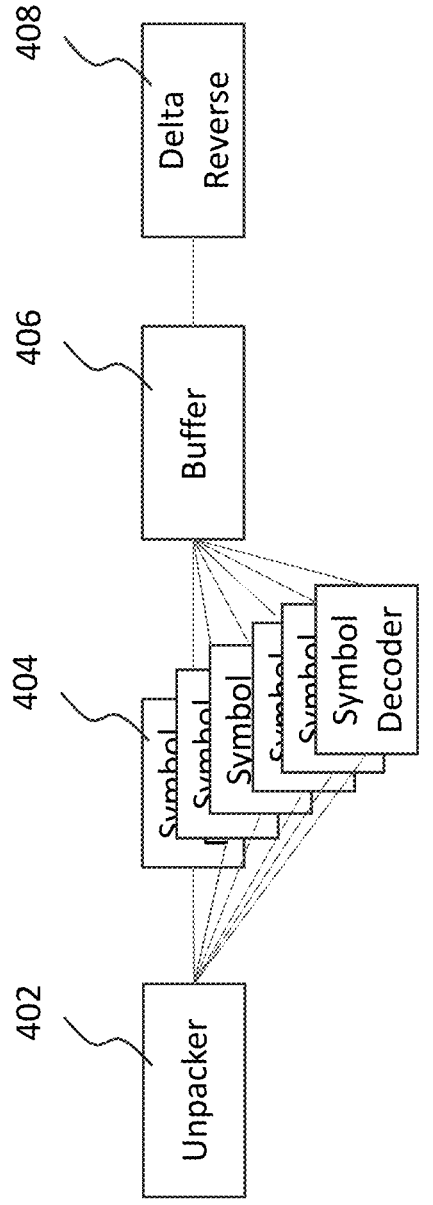
Figure 6

1000

1002 Receive data at a first network-on-chip (NoC) manager circuit (NMC)

1004 Compress the received data

1006 Store the compressed data

1008 Retrieve, by a second NMC of the NoC, the stored compressed data

1010 Decompress, by the second NMC, the retrieved compressed data.

1100

Decompress, by a first decompressor, the received compressed datastream using a plurality of symbol decoders — 1102

Perform the decompression of the received compressed datastream concurrently by the plurality of symbol decoders — 1104

Output the decompressed datastream from the first decompressor — 1106

SYSTEM-LEVEL DATA COMPRESSION SCHEME

BACKGROUND

Contemporary processing systems are at the forefront of handling increasingly complex data workflows, necessitating substantial bandwidth to accommodate the rapid growth in data volume and speed requirements. As these systems evolve, they are projected to support higher resolutions and more intricate processing tasks, which will quadruple the bandwidth demands. This surge in data throughput places a premium on the efficiency of data communication within the architecture of Systems-on-Chip (SoCs), and may utilize a Network-on-Chip (NoC) architecture.

BRIEF DESCRIPTION OF THE DRAWINGS

For a more complete understanding of the present invention, and the advantages thereof, reference is now made to the following descriptions taken in conjunction with the accompanying drawings.

FIG. 6 is a block diagram of a decompressor within an integrated circuit, illustrating the implementation for bit-plane compression (BPC), in accordance with some implementations.

Figure 1:
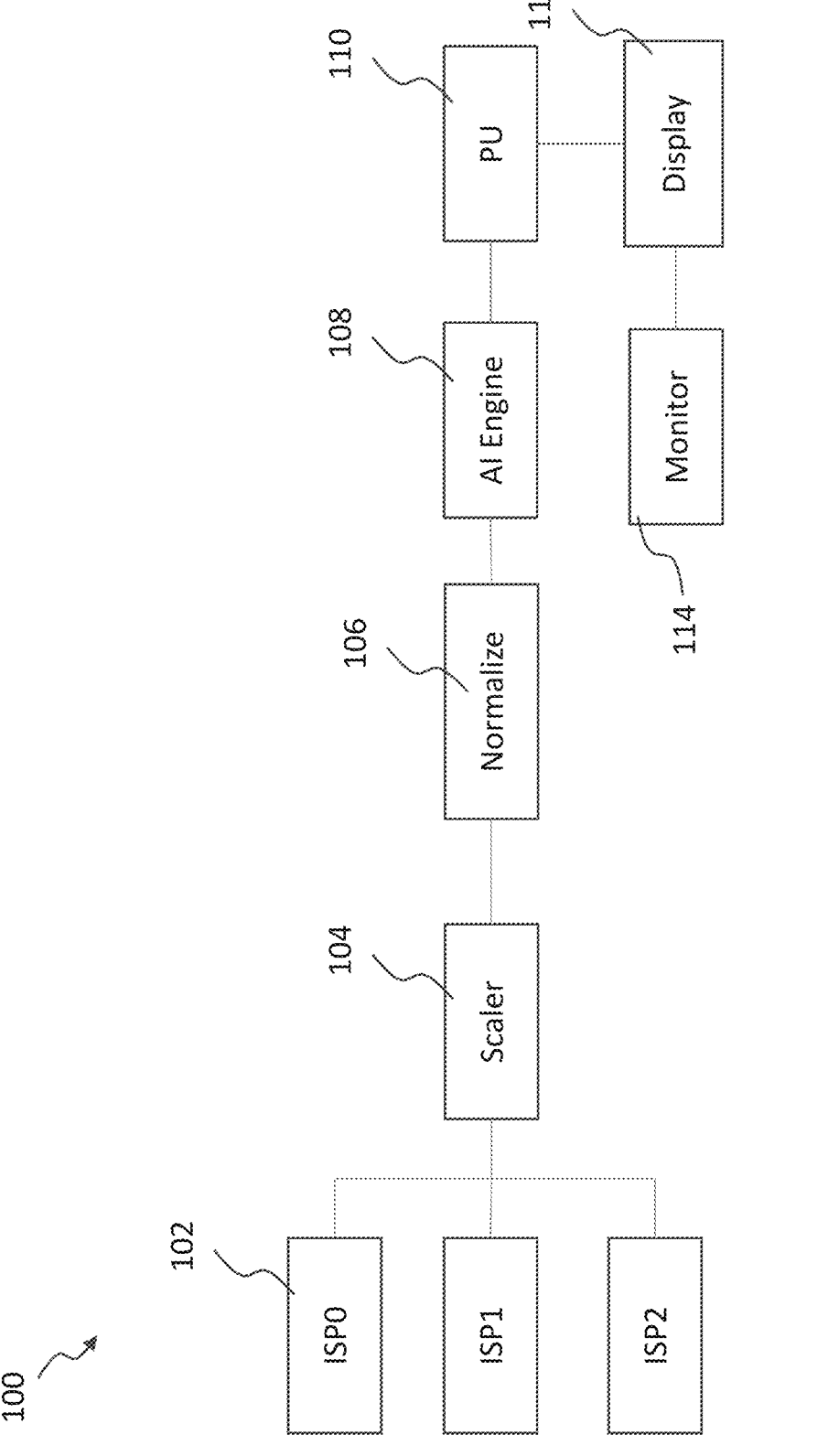
FIG. 1 is a block diagram illustrating the dataflow and interconnection of various components within a vision system, in accordance with some implementations.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope.

Reference to "an implementation," "one implementation," "an embodiment," or "one embodiment" in the framework of the present description is intended to indicate that a particular configuration, structure, or characteristic described in relation to the implementation/embodiment is included in at least one implementation/embodiment. Hence, phrases such as "in one implementation" or "in one embodiment" that may be present in one or more points of the present description do not necessarily refer to one and the same implementation/embodiment. Moreover, particular conformations, structures, or characteristics may be combined in any adequate way in one or more implementations/embodiments. The references used herein are provided merely for convenience and hence do not define the extent of protection or the scope of the implementations/embodiments.

The present disclosure generally pertains to high-bandwidth data processing systems, such as video processing systems. The present disclosure further pertains to the optimization of data communication within these high-bandwidth data processing systems. These systems, such as AI Box and in-car surround vision, utilize a complex video pipeline at high frame rates. The video pipelines are expected to have 8K resolution in the next generation, thus quadrupling the bandwidth requirements. The Systems-on-Chip (SoCs) targeting these video applications comprise of disparate video IPs such as the video codec, image sensor processor (ISP), video scaler, and display engine.

The bandwidth requirements on the Double Data Rate (DDR) memory in these SoCs are often in hundreds of gigabytes per second (GBps), which has a direct impact on area, cost, and power consumption. The communication between individual blocks in these SoCs is typically through the DDR memory. A Network-on-Chip (NoC) is often used in these SoCs to facilitate the communication between the video IPs and the DDR subsystem. The NoC comprises of a plurality of NoC manager circuits (NMCs) and a plurality of switches that are interconnected and communicatively link the NMCs with the memory circuit.

The recited implementations generally include a network-on-chip (NoC). The NoC includes a plurality of NoC manager circuits (NMCs), each NMC comprising a compressor and a decompressor. The compressor is configured to losslessly compress datastreams, and the decompressor is configured to decompress the compressed datastreams. The compressed datastreams include symbols, and the decompressor includes a plurality of symbol decoders configured to decode in parallel the compressed datastreams.

The integrated circuit also includes a memory circuit and a plurality of switches. The memory circuit in the integrated circuit serves as the central data storage. It stores the compressed datastreams and provides them to the NMCs for decompression and further processing. The switches are interconnected and communicatively link the plurality of NMCs with the memory circuit. The switches facilitate the transfer of data between the NMCs and the memory circuit, enabling efficient data communication within the integrated circuit.

Each NMC in the NoC is responsible for managing the data flow between the endpoint circuits and the rest of the network. The NMCs include a compressor for compressing the input data and a decompressor for decompressing the output data. The compressor and decompressor in each NMC enable the lossless compression and decompression of datastreams, providing optimized data communication within the integrated circuit without requiring a user to add more hardware to enable compression in the integrated circuit. Implementations of the present disclosure in an automotive surround vision system have demonstrated a 21.5% reduction in bandwidth requirements as compared to conventional systems.

Referring to FIG. 1, a vision system 100 is illustrated in accordance with some implementations. The vision system 100 includes various components that are interconnected to facilitate dataflow and processing within the system. These components include one or more image sensor processors 102, a video scaler 104, a normalizer 106, an AI engine 108, an accelerated processing unit (APU) 110, a display engine 112, and a display monitor 114.

The image sensor processor 102 is responsible for processing the image data captured by the image sensors or cameras. The processed image data is then sent to the video scaler 104. The video scaler 104 adjusts the size of the video frames to match the desired output resolution. This scaled video data is then passed to the normalizer 106.

The normalizer 106 adjusts the video data to a standard format, ensuring that the data is in a form that can be processed by the subsequent components of the system. For example, the normalizer 106 adjusts parameters such as color space, bit depth, aspect ratio, or frame rate to match predefined standards or the requirements of downstream components like AI engines or display units.

The AI engine 108 receives the normalized video data. The AI engine 108 is a specialized component designed to handle complex computations associated with artificial intelligence (AI) algorithms. The AI engine 108 processes the video data, which involves analyzing the data and applying various AI algorithms to it. These algorithms are mathematical models that are designed to mimic human intelligence and are capable of learning from data, making predictions, and making decisions.

The AI algorithms applied by the AI engine 108 can vary depending on the specific tasks that the system is designed to perform. For instance, the AI engine 108 could apply machine learning algorithms to identify patterns in the video data, deep learning algorithms to recognize objects or features in the video frames, or reinforcement learning algorithms to make decisions based on the video data.

Through the application of these AI algorithms, the AI engine 108 is able to extract useful information from the video data. This could include identifying objects or people in the video frames, recognizing actions or events occurring in the video, or predicting future frames based on the current video data. The extracted information can then be used for various purposes, such as enhancing the video quality, providing insights for decision-making, or enabling advanced features like object tracking or scene recognition.

Furthermore, the AI engine 108 can also perform specific tasks based on the processed video data. These tasks could include adjusting the video parameters for better viewing experience, generating alerts based on detected events in the video, or controlling other components of the system based on the insights derived from the video data.

The processed data from the AI engine 108 is then conveyed to a processor 110, such as an accelerated processing unit (APU), a graphics processing unit (GPU), or other types of processors. The processor 110 is tasked with further refining the data, executing operations that may include rendering graphics, performing complex calculations, or carrying out additional processing tasks. Subsequently, the data that has been processed by this unit is transmitted to the display engine 112.

The display engine 112 is responsible for controlling the display monitor 114, which is the user-facing component of the system. The display engine 112 receives the processed data from the processor 110. This data has undergone various stages of processing, including compression, decompression, normalization, and application of artificial intelligence algorithms.

Once the display engine 112 receives this processed data, it undertakes the task of converting it into a format that can be displayed on the display monitor 114. This conversion process involves translating the digital data into a visual format that can be rendered on the screen of the display monitor 114. This could involve processes such as color space conversion, frame rate adjustment, or resolution scaling, depending on the specific requirements of the display monitor 114 and the nature of the processed data.

Upon successful conversion of the processed data into a displayable format, the display engine 112 sends this data to the display monitor 114. The display monitor 114 then presents the final output to the user. This output is the culmination of the various processing stages that the data has undergone within the vision system 100. It represents the final product that the user interacts with, whether it be a video stream, a graphical user interface, or any other form of visual data.

In this way, the vision system 100 facilitates the flow of data from the image sensor processors 102 through various processing stages to the final output on the display monitor 114.

Figure 2:
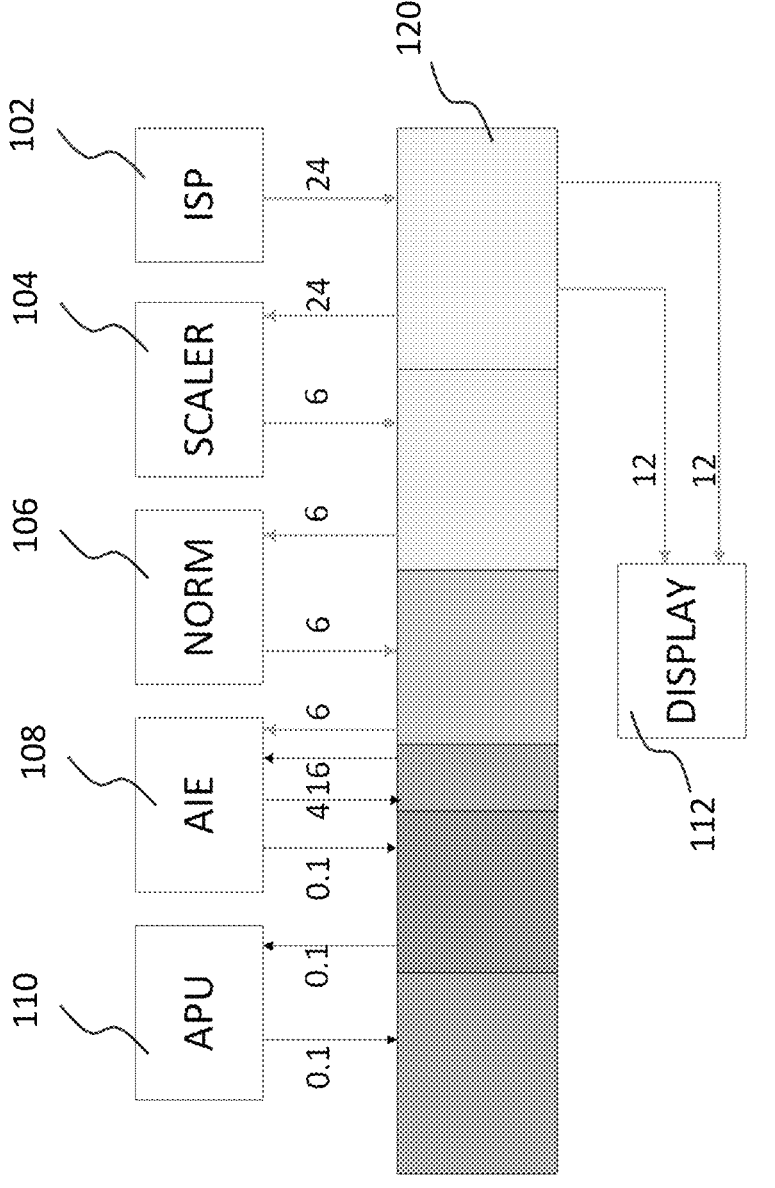
FIG. 2 is a block diagram illustrating the dataflow and interconnection of various components within a vision system, including a memory subsystem, in accordance with some implementations.
Figure 2:

Referring to FIG. 2, a block diagram of the vision system 100 is illustrated, showing the dataflow and interconnection of various components within the system 100, including a memory subsystem. The components of the system 100 include the image sensor processor 102, the video scaler 104, the normalizer 106, the AI engine 108, the processor 110, and the display engine 112. Each of these components 102, 104, 106, 108, and 110 have connections to and from a memory 120, which serves as the central data storage for the system 100.

While FIG. 1 illustrated the dataflow of the vision system 100 going directly between components 102, 104, 106, 108, 110, 112, and 114, in reality, each of the components is connected to the memory 120 with the data flowing to and from the memory between the components 102, 104, 106, 108, 110, and 112.

The memory 120 can be implemented as a Double Data Rate (DDR) memory. DDR memory is a type of synchronous dynamic random-access memory (SDRAM) that can transfer data on both the rising and falling edges of the clock signal. This effectively doubles the memory chip's data throughput without increasing the frequency of the data. The vision system can utilize various types of DDR memory such as DDR1, DDR2, DDR3, and DDR4, each offering different data rates and power consumption levels. Each of these DDR memory types could be used in the vision system 100, depending on the specific requirements of the system, such as the desired data rate, power consumption, and cost.

The connections between the components 102, 104, 106, 108, 110, 112 and the memory 120 each have a number on the connection (e.g., 0.1, 4, 6, 12, 16, 24, etc.) indicating examples of bandwidths, in GBps, for each of those connections. The vision system 100 in FIG. 2 has a total bandwidth of 116 GBps. Each of the connections between the components 102, 104, 106, 108, 110, and the memory 120 can utilize compressed data communication in the connection. However, in some implementations, the compression technique is selectively applied to the connections based on their bandwidth requirements, with the larger bandwidth connections typically utilizing compressed data communication. For example, in some implementations, the connections between the ISPs 102, the scaler 104, the normalizer 106, the display engine 112, and the memory 120 use compressed data communication, but the connections between the PU 110 and the AI engine 108 and the memory 120 do not use compressed data communication. By having the compression and decompression done at the NMC level in the NoC, this optimization of compression techniques is enabled by the implementations of the present disclosure.

FIG. 2 illustrates multiple regions in the memory 120 as the memory 120 may be divided into regions as not all of the data is shared by the components 102, 104, 106, 108, 110 at the same time. This division of the memory 120 into regions allows for efficient data storage and retrieval, as each component can access its respective region of the memory 120 without interfering with the data of the other components.

In some implementations, the compressed data is stored in the memory 120 at the same 256-byte-aligned address as the 256-byte uncompressed data. This specific arrangement is designed to enhance the efficiency of data storage and retrieval within the system 100. By using the same addressing scheme for both the compressed and uncompressed data, the system can streamline the process of data management. This is particularly beneficial in a high-bandwidth data processing system where large volumes of data are continuously being processed and transferred.

Storing the compressed data at the same 256-byte-aligned address as the uncompressed data eliminates the complexity of having to manage two different addressing schemes for the compressed and uncompressed data. This simplifies the data management process but also reduces the potential for errors that could arise from managing two different addressing schemes. Furthermore, this arrangement allows for a seamless transition between the compressed and uncompressed data, as the same addressing scheme can be used to access both types of data.

Moreover, this feature contributes to the overall efficiency of the data communication process within the system 100. Efficient data communication is an important aspect of high-bandwidth data processing systems, as it directly impacts the speed and performance of the system. By simplifying the data management and enhancing the efficiency of data storage and retrieval, this feature helps to optimize the data communication process, improving the overall performance of the system.

Figure 3:
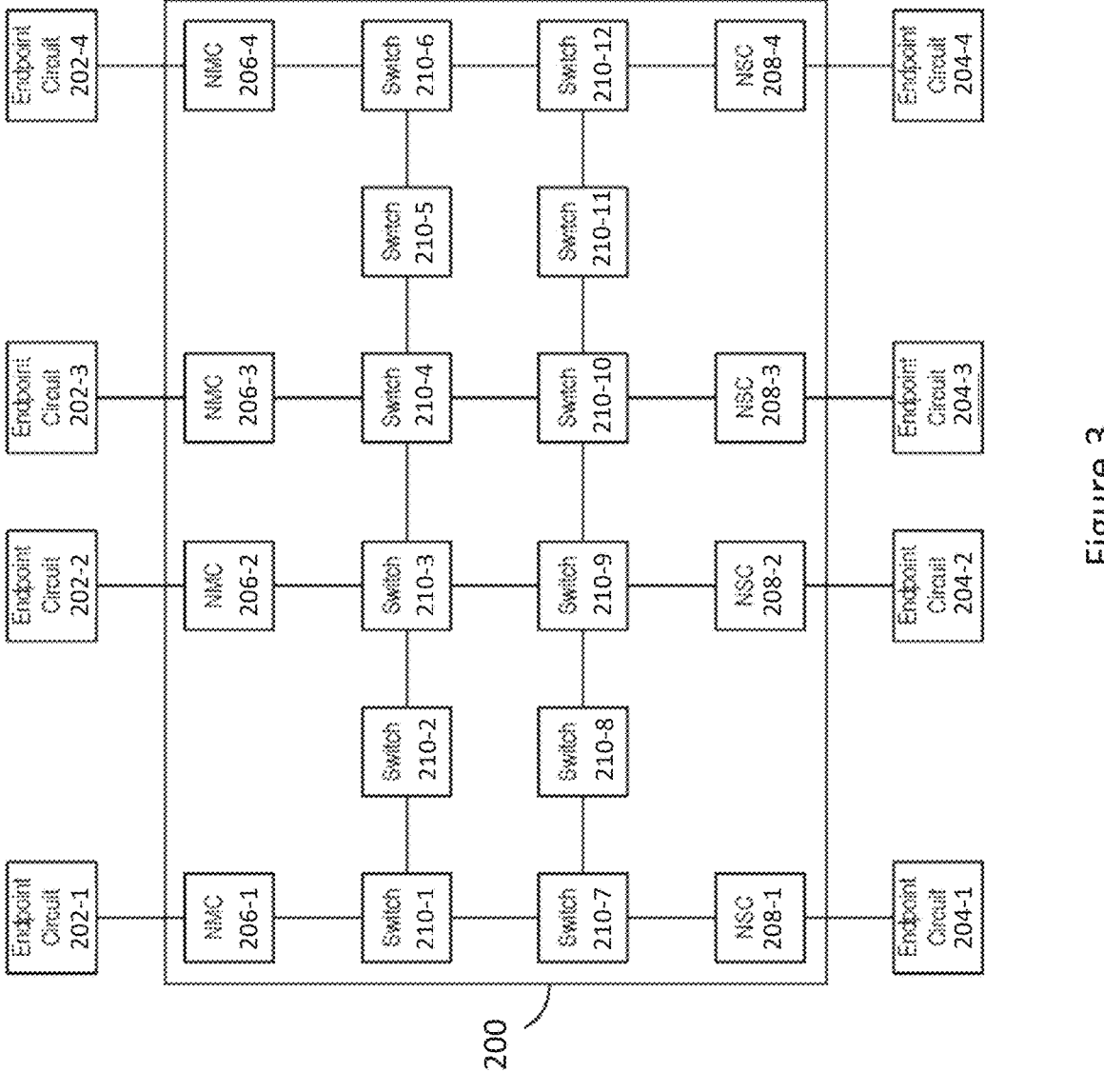
FIG. 3 is a block diagram of a network-on-chip (NoC) system that may be implemented within an integrated circuit, in accordance with some implementations.

Referring to FIG. 3, a network-on-chip (NoC) 200 that may be implemented within an integrated circuit is illustrated. The NoC 200 is capable of conveying data between endpoint circuits 202 (e.g., 202-1, 202-2, 202-3, and/or 202-4) and endpoint circuits 204 (e.g., 204-1, 204-2, 204-3, and/or 204-4). In this example, for purposes of illustration, endpoint circuits 202 may represent data producer circuits, such as image sensor processors, while endpoint circuits 204 may represent data consumer circuits, such as memory or a display engine.

The NoC 200 includes a plurality of NoC manager circuits (NMCs) 206 (e.g., 206-1, 206-2, 206-3, and 206-4), a plurality of NoC service circuits (NSCs) 208 (e.g., 208-1, 208-2, 208-3, and 208-4), and a plurality of switches 210 (e.g., 210-1, 210-2, 210-3, 210-4, 210-5, 210-6, 210-7, 210-8, 210-9, 210-10, 210-11, and 210-12). The NMCs 206 and the NSCs 208 are examples of interface circuits through which data may enter the NoC 200 and/or exit the NoC 200.

Each NMC 206 and each NSC 208 may be implemented as a two-way interface allowing data to enter and exit NoC 200. In general, NMCs 206 are examples of interfaces that are capable of receiving data from endpoint circuits 202 while NSCs 208 are examples of interfaces that are capable of outputting data to endpoint circuits 204. Each NMC 206 and each NSC 208 may be implemented as a two-way interface allowing endpoint circuits 204 to respond to endpoint circuits 202, such that data may enter and exit NoC 200 via each NMC 206 and/or NSC 208.

In the example, each switch 210 may be connected to an adjacent circuit of NoC 200 in the up, left, right, and down directions so long as such an adjacent circuit in NoC 200 exists. For example, switch 210-3 is capable of receiving data via any of the directions illustrated (e.g., from NMC 206-2, switch 210-2, switch 210-9, and/or switch 210-4) and routing or forwarding the received data to a circuit in any of the other 3 directions. This configuration facilitates efficient data communication within the integrated circuit by enabling the transfer of data between various components of the circuit.

Figure 4:
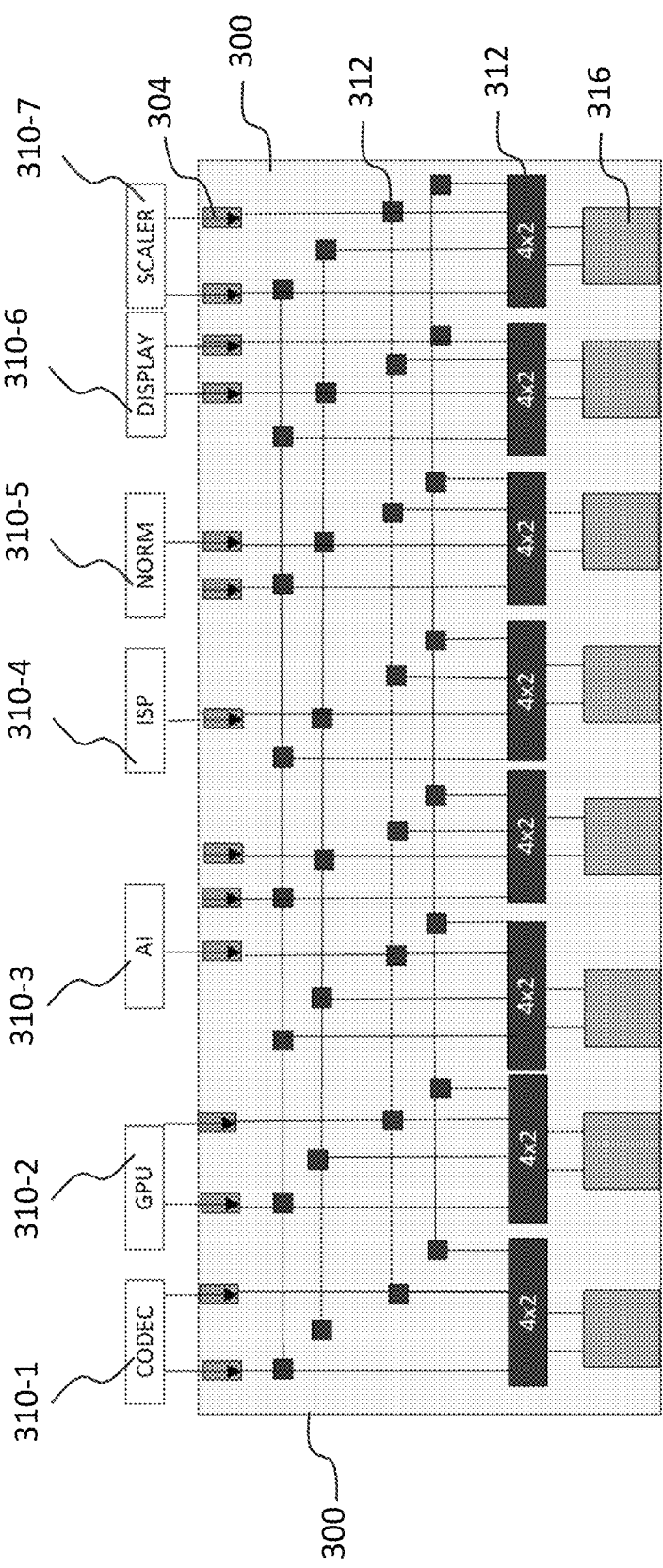
FIG. 4 is a block diagram of a network-on-chip (NoC) system for a vision system, illustrating the dataflow and interconnection of various components, in accordance with some implementations.

Referring to FIG. 4, an example of a network-on-chip (NoC) system 300 for a vision system is illustrated in accordance with some implementations. The NoC system 300 comprises multiple endpoint circuits, including a video codec (CODEC) 310-1, a processor (GPU) 310-2, an AI engine 310-3, an image sensor processor (ISP) 310-4, a normalizer (NORM) 310-5, a display engine 310-6, and a scaler 310-7. These endpoint circuits are connected to a plurality of switches 312, which facilitate the communication of data within the NoC system 300.

The switches 312 are also interconnected to a memory 316, which serves as the central data storage for the system. The memory 316 is configured to store the compressed datastreams at the same 256-byte-aligned address as the 256-byte uncompressed datastreams. This arrangement allows for efficient storage and retrieval of the compressed data, as the same addressing scheme can be used for both the compressed and uncompressed data.

Each endpoint circuit 310-1 to 310-7 is linked to the NoC system 300 through a corresponding NoC manager circuit (NMC) 304, which manages the data flow between the endpoint circuits and the rest of the network. In some implementations, each NMC 304 includes a compressor and a decompressor. The compressor in the NMC 304 is configured to compress the datastreams by applying a bit-plane compression (BPC) algorithm. The BPC algorithm used by the compressor uses nearest-pixel difference for spatial de-correlation, a matrix transpose for binarization, and a run-length encoder to compress the data.

In some implementations, each of the NoC manager circuits 304 is configured to selectively apply the compression technique to various datastreams based on the bandwidth requirements of the datastreams. This selective application of the compression technique allows for efficient data communication within the integrated circuit, as it enables the optimization of the bandwidth usage based on the specific requirements of each datastream. Further, because in these implementations the NMC 304 compresses the incoming video data and de-compresses the outgoing video data, as a result, the compression and de-compression is transparent to the rest of the system.

In some implementations, other components in the NoC system 300 may include the compressors and/or the decompressors. For example, the NoC service circuits (NSCs), the switches, or other components in the NoC system 300 may include a compressor and decompressor.

Figure 5:
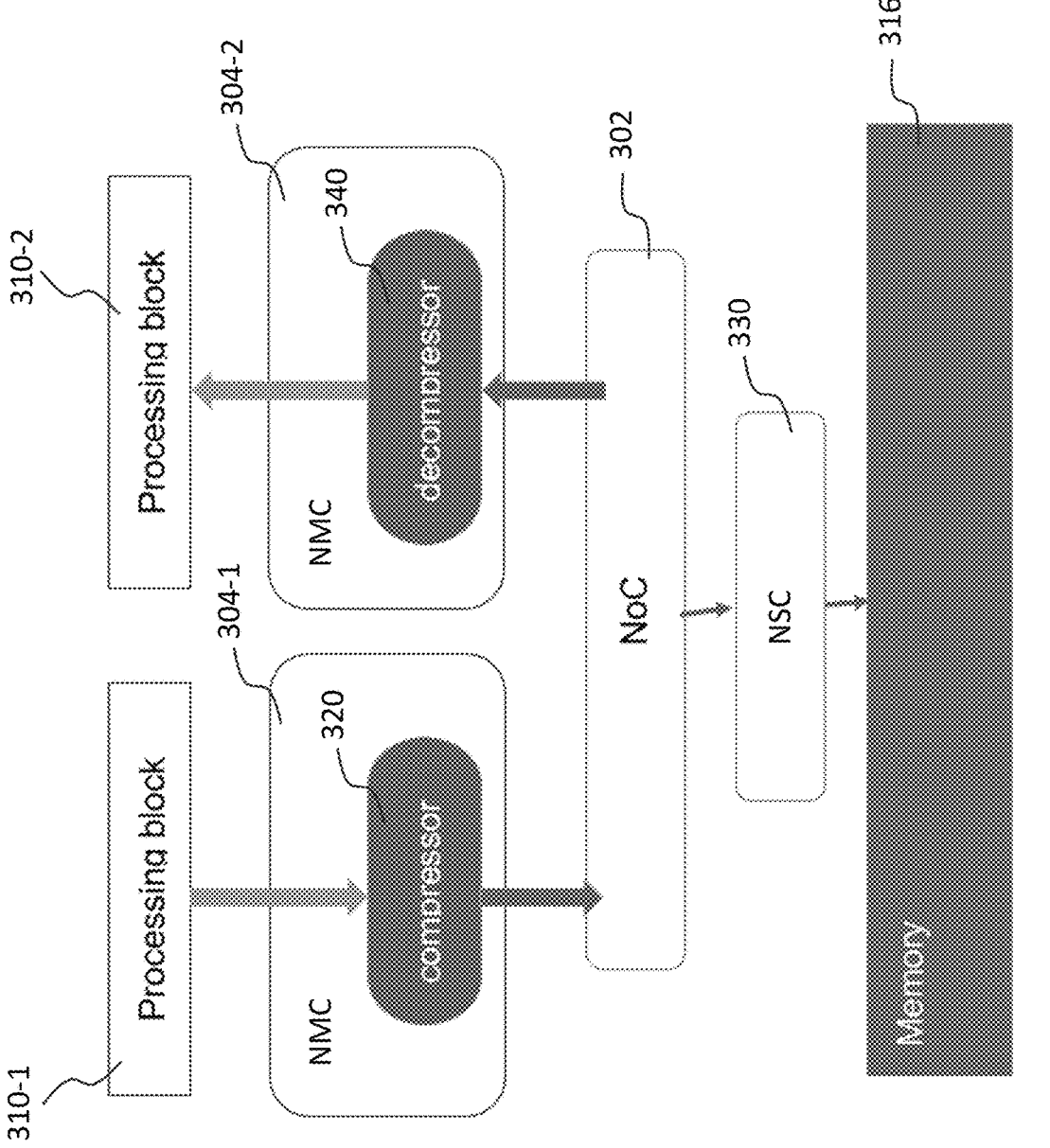
FIG. 5 is a block diagram illustrating the parallel decoding process of a compressed datastream within an integrated circuit, in accordance with some implementations.

Referring to FIG. 5, a block diagram of a data flow within the vision system 100 is illustrated in accordance with some implementations. The system includes two endpoint circuits 310-1 and 310-2 (e.g., ISP, PU, normalizer, scaler, AI engine, etc.), which are connected to their respective NMCs 304-1 and 304-2. The first NMC 304-1 includes a compressor 320, while the second NMC 304-2 includes a decompressor 340. Both NMCs are interconnected via the NoC 300, which facilitates data communication to the various components on and connected to the IC or chip.

The endpoint circuits 310-1 and 310-2 generate and process datastreams. For example, the endpoint circuit 310-1 is an ISP, and the endpoint circuit 310-2 is the video scaler. These datastreams are then sent to the respective NMCs 304-1 and 304-2 for further processing. The first NMC 304-1 includes a compressor 320, which is configured to compress the datastreams received from the endpoint circuit 310-1. In some implementations, the compressor 320 applies a lossless compression algorithm to the datastreams, reducing the size of the datastreams without losing any information.

The compressed datastreams are then transferred through the network-on-chip system 300 to the memory 316 through a NoC service circuit (NSC) 330. The endpoint circuit 310-2 needs to process the datastream and retrieves the compressed datastream from the memory 316 by way of the NSC 330, the NoC 300, and the second NMC 304-2. The second NMC 304-2 includes a decompressor 340, which is configured to decompress the compressed datastreams received from the network-on-chip system 300. The decompressor 340 applies a decompression algorithm to the compressed datastreams, restoring the original datastreams.

The compressor 330 and the decompressor 340 can utilize various compression techniques and methods to optimize bandwidth and storage requirements, such as bitplane compression, CABAC, Golomb, or the like. Bitplane compression (BPC) compresses data by exploiting spatial redundancy and encoding the data in bitplanes, often using methods like nearest-pixel difference for spatial de-correlation, matrix transposition for binarization, and run-length encoding.

Context-based Adaptive Binary Arithmetic Coding (CABAC) is a form of entropy encoding used in H.264/ AVC and H.265/ HEVC video compression standards. CABAC adapts to the data being encoded, using a model to estimate probabilities of symbol occurrences, which allows for more efficient data representation.

Golomb coding, and its variant, Golomb-Rice coding, are also used for lossless data compression. These techniques are well-suited for data with geometric distribution, making them useful for compressing sparse datastreams. Other compression techniques that may be considered include Huffman coding, which is a type of entropy encoding used for lossless data compression, and Lempel-Ziv-Welch (LZW) compression, which is a dictionary-based coding intended for data streams with repeated patterns. The choice of compression technique can be based on the specific characteristics of the data, the requirements of the system, and the desired balance between compression efficiency and computational complexity.

While the following implementations specifically discuss bitplane compression (BPC), the present disclosure is not limited to only BPC and other compression techniques and methods are within the contemplated scope of the disclosure.

Referring to FIG. 6, a block diagram of a decompressor 340 within an integrated circuit is illustrated in accordance with some implementations. In FIG. 6, the decompressor 340 is implemented for bitplane compression (BPC). The decompressor 340 comprises a symbol unpacker 402, a plurality of symbol decoders 404, a buffer 406, and a delta reverser 408.

In the decompression process, the symbol unpacker 402 receives the compressed data, which is in a compact and encoded format, and unpacks it into a format that is suitable for decoding. This unpacking process involves the transformation of the compressed data into a more accessible and interpretable form, which can then be processed by the symbol decoders 404.

Once the data has been unpacked by the symbol unpacker 402, it is then fed into the symbol decoders 404. These decoders are designed to interpret the unpacked data and convert it back into its original form. The symbol decoders 404 are connected in parallel to the symbol unpacker 402, which allows for simultaneous decoding of the unpacked data. This means that multiple symbols can be decoded at the same time, rather than sequentially.

This parallel decoding process improves the efficiency and throughput of the decompression process. By enabling multiple symbols to be decoded at the same time, the decompression process can be completed more quickly and efficiently. This is particularly beneficial in high-bandwidth data processing systems, where large volumes of data are being processed and any efficiency gains can have a substantial impact on overall system performance.

In the BPC implementation, there are five potential symbol lengths—2, 5, 8, 10, and 32 bits—for the decoded symbols. Thus, the decompressor 340 includes six symbol decoders 404 in parallel so that two symbols can be decoded at the same time. For example, a first symbol is started being decoded, but at that time the length of the first symbol is unknown. To start decoding the next symbol before the first symbol is finished, five other decoders are used to decode the next symbol using the five potential start points for the second symbol. This is because the number of possible lengths for the first symbol is five. This configuration allows for efficient decoding of symbols of varying lengths, optimizing the decompression process.

Once the symbols are decoded, the decoded data is temporarily held in the buffer 406. The buffer 406 serves as a temporary storage for the decoded data, allowing for efficient data management during the decompression process. The decoded data held in the buffer 406 is then processed by the delta reverser 408, which restores the original data values. The delta reverser 408 applies a reversal operation to the decoded data, restoring the original data values. This final reversal of delta encoding completes the decompression process, resulting in the restoration of the original data.

Figure 7:
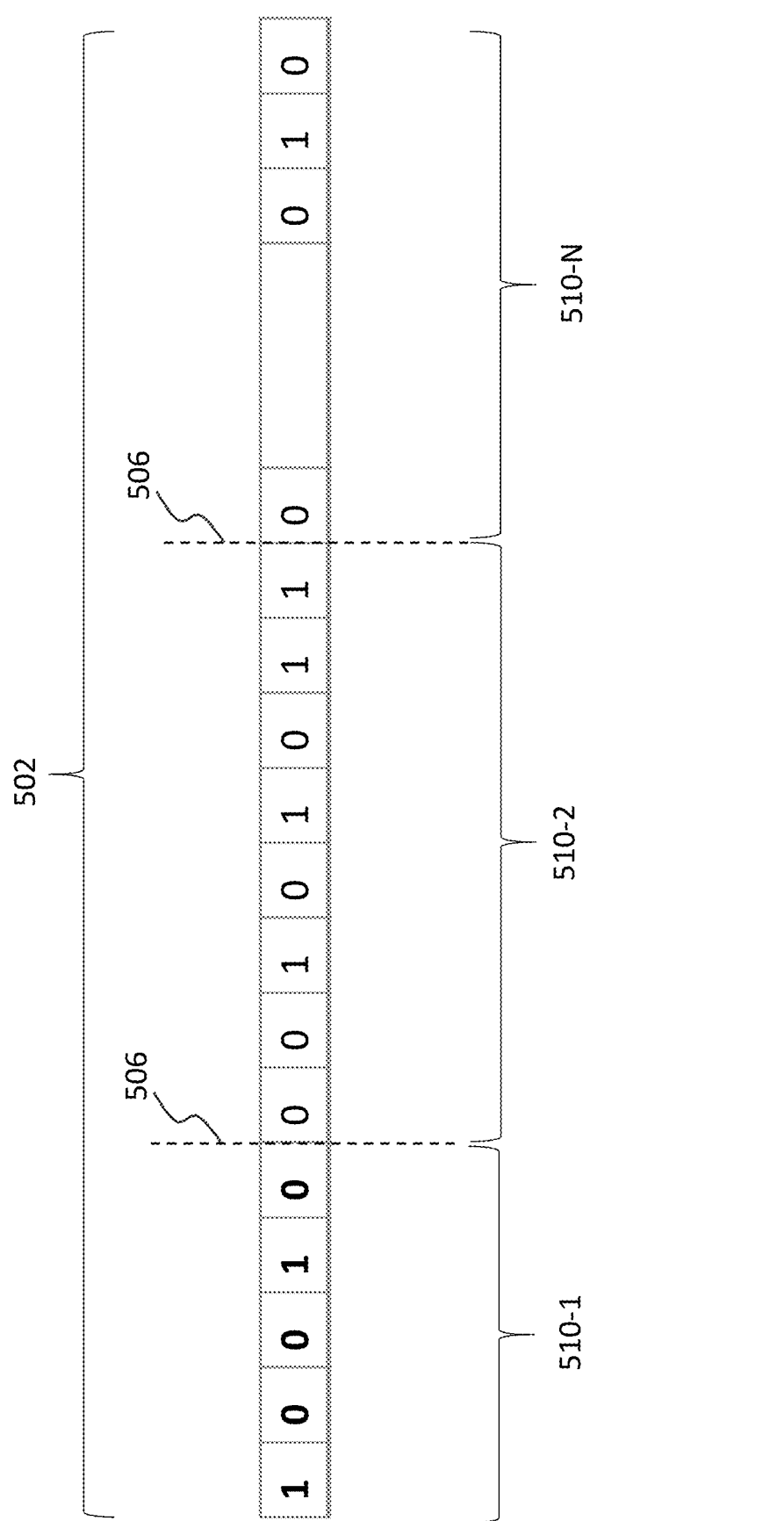
FIG. 7 is a diagram of an example datastream, where a sequence of symbols is depicted, in accordance with some implementations.

Referring to FIG. 7, an example of a datastream 502 is illustrated, where a sequence of symbols 510 is depicted. Each symbol, such as symbol 510-1, symbol 510-2, and symbol 510-N, is separated by symbol start/end markers 506. These markers indicate the beginning and end of each symbol within the datastream 502. The symbols are represented in a binary format, with a series of 1s and 0s, and are arranged in a linear sequence along the datastream 502.

The symbols in the datastream 502 represent the compressed data that is to be decompressed by the decompressor in the NMC. Each symbol corresponds to a specific data value, and the sequence of symbols represents the sequence of data values in the original datastream before compression. The use of symbols in the datastream 502 allows for efficient representation of the data, as each symbol can represent multiple bits of data. This symbol-based representation of the data contributes to the compression of the datastream, reducing the size of the datastream and optimizing the use of memory and bandwidth within the system.

Figure 8:
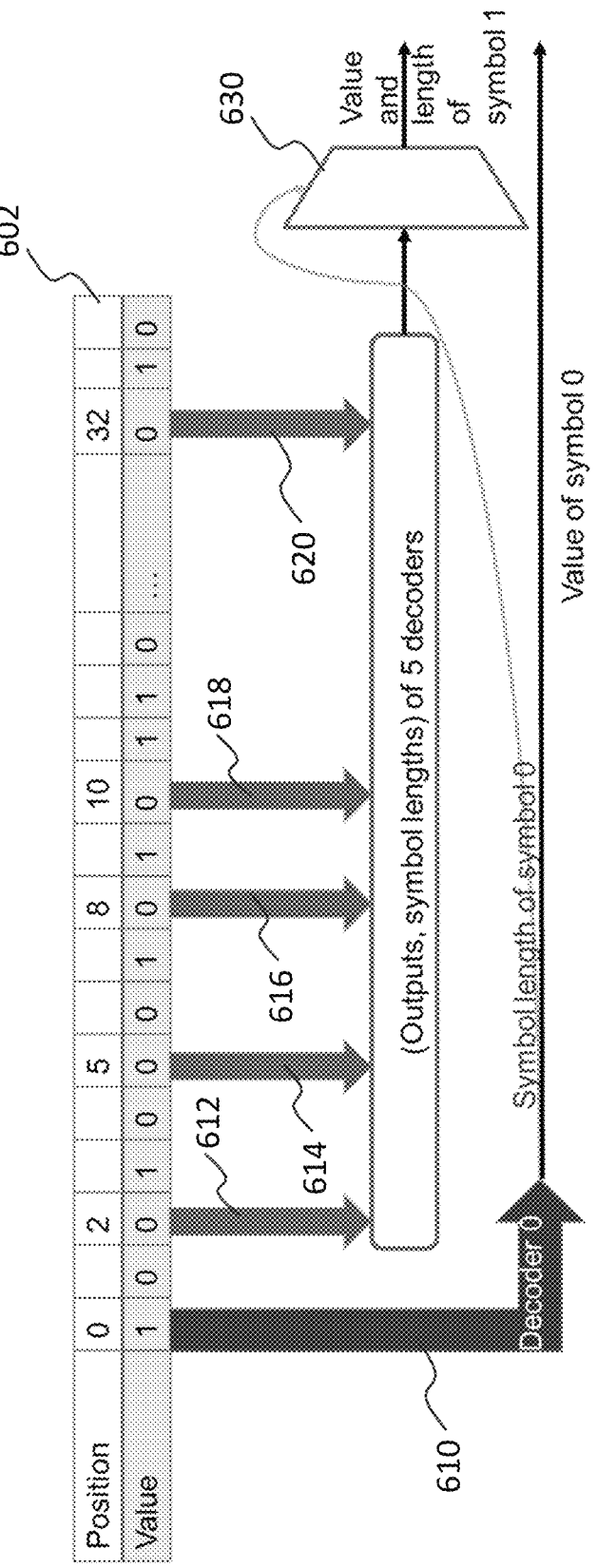
FIG. 8 is a block diagram illustrating the parallel decoding process of a compressed datastream, in accordance with some implementations.

Referring to FIG. 8, a block diagram illustrates the parallel decoding process of a compressed datastream 602. The datastream 602 is input to six decoders, with the first decoder output 610, second decoder output 612, third decoder output 614, fourth decoder output 616, fifth decoder output 618, and sixth decoder output 620 shown as separate paths. Each decoder output 610, 612, 614, 616, 618, and 620 represents the value and symbol length of the decoded symbols. These outputs 610, 612, 614, 616, 618, and 620 are then input into a multiplexer 630.

The five potential symbol lengths in BPC are 2, 5, 8, 10, and 32 bits. Thus, in the illustrated BPC implementation, the first decoder starts at bit 0, the second decoder starts at bit 2, the third decoder starts at bit 5, the fourth decoders starts at bit 8, fifth decoder starts at bit 10, and the sixth decoder starts at bit 32. Thus, if the first symbol decoded by the first decoder has a length of 8 bits, then the fourth decoder output 616 will be the correct output to use for second symbol as the fourth decoder started decoding on bit 8.

When the first decoder is done decoding the first symbol, that first symbol is output 610 from the symbol decoder. The information (e.g., length) from the first symbol is also input into the multiplexer 630 to select which output of the other five decoders, 612, 614, 616, 618, or 620, to use for the second symbol. As illustrated, the other five decoders, 612, 614, 616, 618, or 620, have different starting points for decoding based on the potential endpoints for the first symbol. This configuration allows for efficient decoding of symbols of varying lengths and results in improved throughput and efficiency for the decompression process.

The decompression of retrieved compressed data is enhanced by employing a plurality of symbol decoders, each configured to decode symbols of different lengths. This design facilitates the efficient processing of variable-length symbols within the datastream, streamlining the decompression workflow. By enabling multiple symbol decoders to operate concurrently, the system can decode several symbols simultaneously, which improves the throughput and overall performance of the decompression process. This parallel decoding architecture not only expedites the data handling but also contributes to the optimization of data communication across the system.

Figure 9:
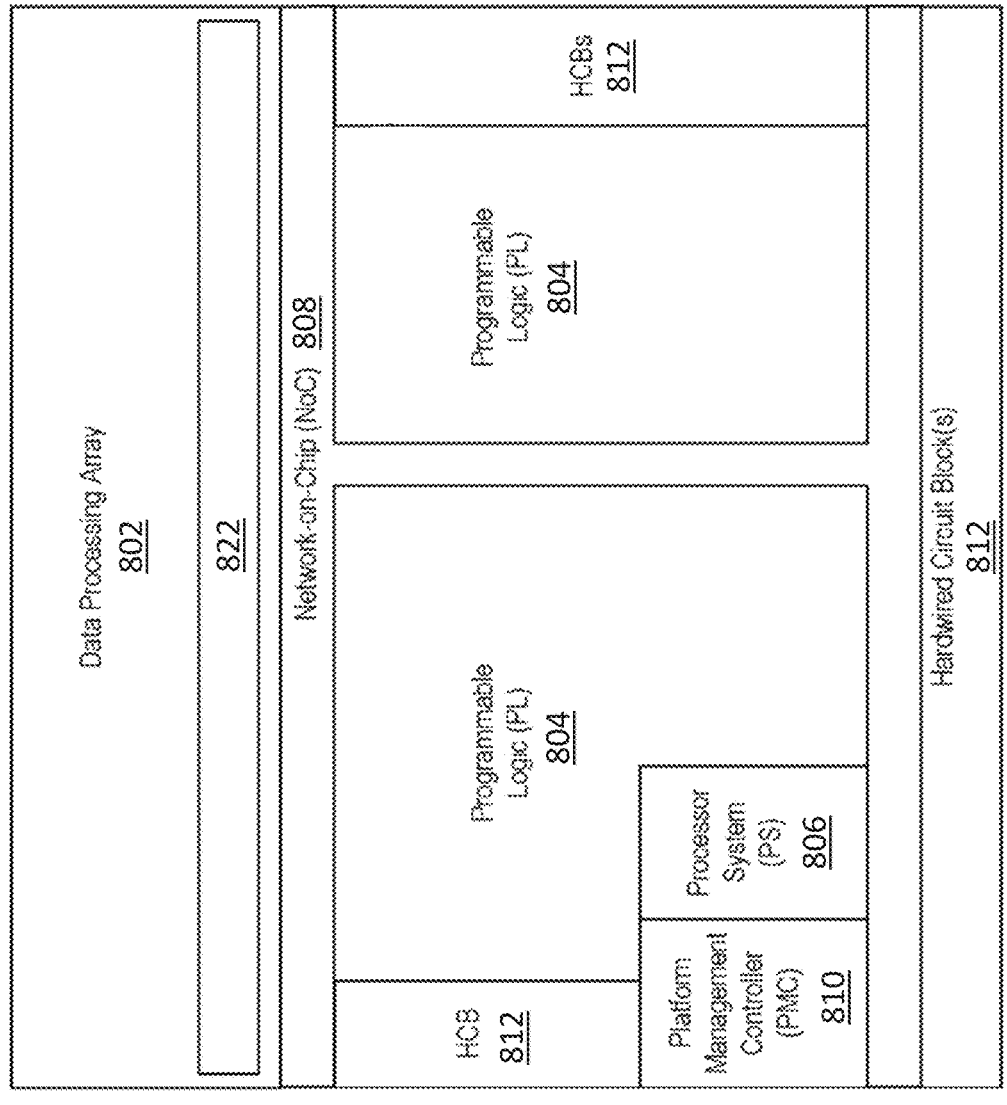
FIG. 9 illustrates an example architecture for an integrated circuit including a network-on-chip (NoC), in accordance with some implementations.

Referring to FIG. 9, an example architecture 800 for an integrated circuit (IC) including a network-on-chip (NoC) 808 is illustrated. The architecture 800 may be used to implement a programmable IC, an adaptive system, and/or a System-on-Chip (SoC). In the example of FIG. 9, architecture 800 is implemented on a single die provided within a single package. In other examples, architecture 800 may be implemented using a plurality of interconnected dies within a single package where the various resources of architecture 800 (e.g., circuits) illustrated in FIG. 9 are implemented across the different interconnected dies.

The architecture 800 includes a plurality of different subsystems including a data processing array 802, programmable logic (PL) 804, a processor system (PS) 806, a Network-on-Chip (NoC) 808, a platform management controller (PMC) 810, and one or more hardwired circuit blocks 812. The data processing array 802 is implemented as a plurality of interconnected and programmable compute tiles. Each compute tile can include one or more cores and a data memory. In one example implementation, the cores of the compute tiles may be implemented as custom circuits that do not execute program code. In another example implementation, the cores of compute tiles are capable of executing program code stored in core-specific program memories contained within each respective core.

Each compute tile further includes dedicated multi-bit data movement channels connecting the compute tiles. Each compute tile further can include support for direct memory access (DMA) operations and locks to move data to and from data memories of other compute tiles. In one or more other example implementations, data processing array 802 may include one or more memory tiles that replace one or more of the compute tiles.

Data processing array 802 includes an interface block 822 that connects the compute tiles or the memory tiles to other resources of architecture 800. In the example of FIG. 9, interface block 822 includes a plurality of interconnected interface tiles organized in a row. In one example, each of the interface tiles may have a same architecture. In another example, the interface tiles may be implemented with different architectures where each different interface tile architecture supports communication with different types of resources of architecture 800. The interface tiles 824 are connected so that data may be propagated from one interface tile to another bi-directionally. Each interface tile is capable of operating as an interface for the column of compute tiles and/or memory tiles directly above.

Programmable logic (PL) 804 is circuitry that may be programmed to perform specified functions. As an example, PL 804 may be implemented as field programmable gate array type of circuitry. PL 804 can include an array of programmable circuit blocks. As defined herein, the term "programmable logic" means circuitry used to build reconfigurable digital circuits. Programmable logic is formed of many programmable circuit blocks that provide basic functionality. The topology of PL 804 is configurable unlike hardwired circuitry. In one aspect, each programmable circuit block of PL 804 includes a programmable element 826 (e.g., a functional element) and a programmable interconnect 842. The programmable interconnects 842 provide the configurable topology of PL 804. The programmable interconnects 842 may be configured on a per wire basis to provide connectivity among the programmable elements 826 of programmable circuit blocks of PL 804 and is configurable on a per-bit basis (e.g., where each wire conveys a single bit of information) unlike connectivity among the compute tiles and/or the memory tiles in data processing array 802, for example.

Processor system (PS) 806 is implemented as hardwired circuitry that is fabricated as part of architecture 800. PS 806 may be implemented as, or include, any of a variety of different processor types each capable of executing program code. For example, PS 806 may be implemented as an individual processor, e.g., a single core capable of executing program code. In another example, PS 806 may be implemented as a multi-core processor. In still another example, PS 806 may include one or more cores, modules, co-processors, I/O interfaces, and/or other resources. PS 806 may be implemented using any of a variety of different types of architectures. Example architectures that may be used to implement PS 806 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

Network-on-Chip (NoC) 808 is a programmable interconnecting network for sharing data between endpoint circuits in architecture 800. The endpoint circuits can be disposed in DP array 802, PL 804, PS 806, and/or selected hardwired circuit blocks 812. NoC 808 can include high-speed data paths with dedicated switching. In an example, NoC 808 includes one or more horizontal paths, one or more vertical paths, or both horizontal and vertical path(s). The arrangement and number of regions shown in FIG. 9 is merely an example. NoC 808 is an example of the common infrastructure that is available within architecture 800 to connect selected components and/or subsystems.

In the example of FIG. 9, nets that are to be routed through NoC 808 are unknown until a design is created for implementation within architecture 800. NoC 808 may be programmed by loading configuration data into internal configuration registers that define how elements within NoC 808 such as switches and interfaces are configured and operate to pass data from switch to switch and among the NoC interfaces to connect the endpoint circuits.

In one aspect, NoC 808 is fabricated as part of architecture 800 (e.g., is hardwired) and, while not physically modifiable, may be programmed to establish connectivity between different master circuits and different slave circuits of a user circuit design. NoC 808, upon power-on, does not implement any data paths or routes therein. Once configured by a master circuit such as PMC 810, however, NoC 808 implements data paths or routes between endpoint circuits. In one or more example implementations, NoC 808 may be implemented as described herein in connection with NoC 200.

Platform management controller (PMC) 810 is responsible for managing architecture 800. PMC 810 is a subsystem within architecture 800 that is capable of managing the other programmable circuit resources across the totality of architecture 800. PMC 810 is capable of maintaining a safe and secure environment, booting architecture 800, and managing architecture 800 during normal operations. For example, PMC 810 is capable of providing unified and programmable control over power-up, boot/configuration, security, power management, safety monitoring, debugging, and/or error handling for the different subsystems of architecture 800 (e.g., DP array 802, PL 804, PS 806, and NoC 808). PMC 810 operates as a dedicated platform manager that decouples PS 806 and from PL 804. As such, PS 806 and PL 804 may be managed, configured, and/or powered on and/or off independently of one another.

Hardwired circuit blocks 812 are special-purpose circuit blocks fabricated as part of architecture 800. Though hardwired, hardwired circuit blocks 812 may be configured by loading configuration data into control registers to implement one or more different modes of operation. Examples of hardwired circuit blocks 812 may include input/output (I/O) blocks, transceivers for sending and receiving signals to circuits and/or systems external to architecture 800, memory controllers, or the like. Examples of different I/O blocks may include single-ended and pseudo differential I/Os. Examples of transceivers may include high-speed differentially clocked transceivers. Other examples of hardwired circuit blocks 812 include, but are not limited to, cryptographic engines, digital-to-analog converters (DACs), analog-to-digital converters (ADCs), and the like. In general, hardwired circuit blocks 812 are application-specific circuit blocks.

Figure 10:
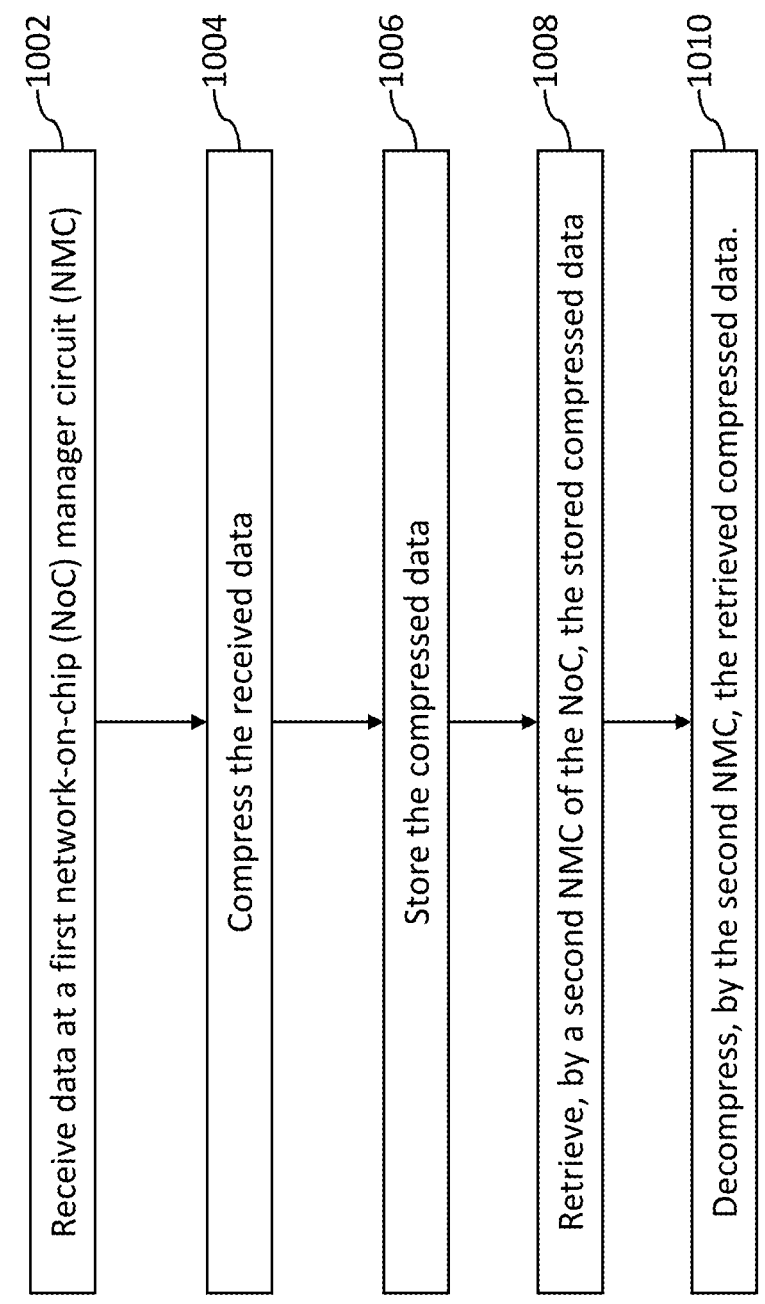
FIG. 10 illustrates a flow chart of a method of data communication in an integrated circuit, in accordance with some implementations.

FIG. 10 illustrates a flow chart of a method 1000 of data communication in an integrated circuit in some implementations. It should be understood that the example method shown in FIG. 10 is merely an example of many possible example methods. A skilled artisan would recognize many variations, alternatives, and modifications. For example, various steps as illustrated in FIG. 7 may be added, removed, replaced, rearranged, or repeated.

Referring to FIG. 10, at block 1002, data is received at a first network-on-chip (NoC) manager circuit (NMC) of a network-on-chip (NoC). At block 1004, the received data is compressed by the first NMC using a lossless compression algorithm. At block 1006, the compressed data is stored in a memory circuit. At block 1008, the stored compressed data is retrieved by a second NMC of the NoC from the memory circuit. At block 1010, the retrieved compressed data is decompressed by the second NMC.

Figure 11:
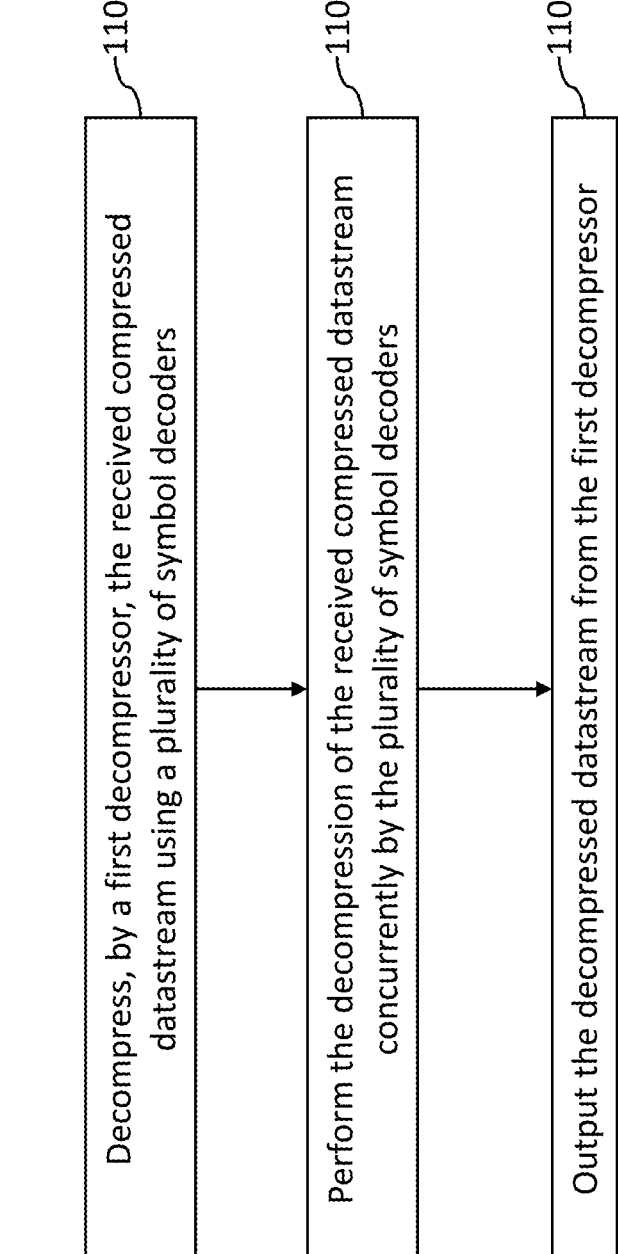
FIG. 11 illustrates a flow chart of a method of decompressing compressed data in a network-on-chip (NoC), in accordance with some implementations.

FIG. 11 illustrates a flow chart of a method 1100 of decompressing compressed data in a network-on-chip (NoC). It should be understood that the example method shown in FIG. 11 is merely an example of many possible example methods. A skilled artisan would recognize many variations, alternatives, and modifications. For example, various steps as illustrated in FIG. 7 may be added, removed, replaced, rearranged, or repeated.

Referring to FIG. 11, at block 1102, a compressed datastream is received by a first decompressor of a first network-on-chip (NoC) manager circuit (NMC) of a NoC from a memory circuit, the compressed datastream comprising symbols. At block 1104, the received compressed datastream is decompressed by the first decompressor using a plurality of symbol decoders, each symbol decoder being configured to decode a different symbol length, the decompression of the received compressed datastream being performed concurrently by the plurality of symbol decoders to decode different portions of the received compressed datastream. At block 1106, the decompressed datastream from the first decompressor is output to a first component of the NoC.

An implementation includes an integrated circuit, a network-on-chip (NoC) a plurality of first circuits, each first circuit may include a compressor and a decompressor, the compressor being configured to compress datastreams, and the decompressor being configured to decompress the compressed datastreams, the compressed datastreams may include symbols, the decompressor may include a plurality of symbol decoders configured to decode in parallel the compressed datastreams. The integrated circuit also includes a memory circuit. The circuit also includes a plurality of switches, the plurality of switches being interconnected and communicatively linking the plurality of first circuits with the memory circuit.

Implementations may include one or more of the following features. The integrated circuit where the compressor is configured to compress the datastreams by applying a bit-plane compression (BPC) algorithm. The BPC algorithm uses nearest-pixel difference for spatial de-correlation, a matrix transpose for binarization, and a run-length encoder to compress the datastreams. Each of the first circuits is configured to selectively apply compression techniques to datastreams based on bandwidth requirements of the datastreams. Each symbol decoder is configured to decode a different symbol length. The plurality of first circuits are a plurality of NoC manager circuits (NMCs).

An implementation includes a method for data communication in an integrated circuit, receiving data at a first network-on-chip (NoC) manager circuit (NMC) of a NoC. The method also includes compressing, by the first NMC, the received data using a lossless compression algorithm. The method also includes storing the compressed data in a memory circuit. The method also includes retrieving, by a second NMC of the NoC, the stored compressed data from the memory circuit. The method also includes decompressing, by the second NMC, the retrieved compressed data.

Implementations may include one or more of the following features. The method where the lossless compression algorithm is a bit-plane compression (BPC) algorithm. Decompressing the retrieved compressed data may include parallelly decompressing the retrieved data using a plurality of symbol decoders, each symbol decoder being configured to decode a different symbol length. The plurality of symbol decoders operate concurrently to decode different portions of the retrieved compressed data. The first NMC and the second NMC communicate with the memory circuit through the NoC. The lossless compression algorithm is selectively applied to datapaths within the NoC. The method may include outputting the decompressed data from the second NMC to a first component of the NoC, the first component being a video scaler, a video normalizer, an artificial intelligence engine, or a display engine. The method may include retrieving, by a third NMC of the NoC, stored uncompressed data from a first component of the NoC, and outputting the uncompressed data from the third NMC to a second component of the NoC.

An implementation includes receiving, by a first decompressor of a first network-on-chip (NoC) manager circuit (NMC) of a NoC, a compressed datastream may include symbols from a memory circuit. The method also includes decompressing, by the first decompressor, the received compressed datastream using a plurality of symbol decoders, each symbol decoder being configured to decode a different symbol length, the decompression of the received compressed datastream being performed concurrently by the plurality of symbol decoders to decode different portions of the received compressed datastream. The method also includes outputting the decompressed datastream from the first decompressor to a first component of the NoC.

Implementations may include one or more of the following features. The method where the compressed datastream is compressed using a bit-plane compression (BPC) algorithm. The first component is a video scaler, a video normalizer, an artificial intelligence engine, or a display engine. The method may include receiving, by a second NMC of the NoC, an uncompressed datastream from the memory circuit, and outputting the uncompressed datastream from the second NMC to a second component of the NoC. The second component is a processor or an artificial intelligence engine. Decompressing, by the first decompressor, the received compressed datastream using the plurality of symbol decoders further may include decoding, by a first symbol decoder of the plurality of symbol decoders, a first symbol of the received compressed datastream, and based on an output of the first symbol decoder, selecting an output of another one of the plurality of symbol decoders to decode a second symbol of the received compressed datastream.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular implementations described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding implementations described herein. Accordingly, the appended claims are intended to include within their scope such processes, machines, manufacture, compositions of matter, means, methods, or steps.

What is claimed is:

1. An integrated circuit, comprising:
a network-on-chip (NoC) comprising:
a plurality of first circuits, each first circuit comprising a compressor and a decompressor, the compressor being configured to compress datastreams, and the decompressor being configured to decompress the compressed datastreams, the compressed datastreams comprising symbols, the decompressor comprising a plurality of symbol decoders configured to decode in parallel the compressed datastreams;
a memory circuit; and
a plurality of switches, the plurality of switches being interconnected and communicatively linking the plurality of first circuits with the memory circuit.

2. The integrated circuit of claim 1, wherein the compressor is configured to compress the datastreams by applying a bit-plane compression (BPC) algorithm.

3. The integrated circuit of claim 2, wherein the BPC algorithm uses nearest-pixel difference for spatial de-correlation, a matrix transpose for binarization, and a run-length encoder to compress the datastreams.

4. The integrated circuit of claim 1, wherein each of the first circuits is configured to selectively apply compression techniques to datastreams based on bandwidth requirements of the datastreams.

5. The integrated circuit of claim 1, wherein each symbol decoder is configured to decode a different symbol length.

6. The integrated circuit of claim 1, wherein the plurality of first circuits are a plurality of NoC manager circuits (NMCs).

7. A method for data communication in an integrated circuit, the method comprising:
receiving data at a first network-on-chip (NoC) manager circuit (NMC) of a NoC;
compressing, by the first NMC, the received data using a lossless compression algorithm;
storing the compressed data in a memory circuit;
retrieving, by a second NMC of the NoC, the stored compressed data from the memory circuit; and
decompressing, by the second NMC, the retrieved compressed data.

8. The method of claim 7, wherein the lossless compression algorithm is a bit-plane compression (BPC) algorithm.

9. The method of claim 8, wherein decompressing the retrieved compressed data comprises parallelly decompressing the retrieved data using a plurality of symbol decoders, each symbol decoder being configured to decode a different symbol length.

10. The method of claim 9, wherein the plurality of symbol decoders operate concurrently to decode different portions of the retrieved compressed data.

11. The method of claim 7, wherein the first NMC and the second NMC communicate with the memory circuit through the NoC.

12. The method of claim 7, wherein the lossless compression algorithm is selectively applied to datapaths within the NoC.

13. The method of claim 7 further comprising:

outputting the decompressed data from the second NMC to a first component of the NoC, the first component being a video scaler, a video normalizer, an artificial intelligence engine, or a display engine.

14. The method of claim 7, further comprising:

retrieving, by a third NMC of the NoC, stored uncompressed data from a first component of the NoC; and outputting the uncompressed data from the third NMC to a second component of the NoC.

15. A method comprising:

receiving, by a first decompressor of a first network-on-chip (NoC) manager circuit (NMC) of a NoC, a compressed datastream comprising symbols from a memory circuit;

decompressing, by the first decompressor, the received compressed datastream using a plurality of symbol decoders, each symbol decoder being configured to decode variable-length symbols, wherein the plurality of symbol decoders start decoding at different bit positions corresponding to potential endpoints of a preceding symbol, the decompression of the received compressed datastream being performed concurrently by the plurality of symbol decoders to decode different portions of the received compressed datastream; and outputting the decompressed datastream from the first decompressor to a first component of the NoC.

16. The method of claim 15, wherein the compressed datastream is compressed using a bit-plane compression (BPC) algorithm.

17. The method of claim 15, wherein the first component is a video scaler, a video normalizer, an artificial intelligence engine, or a display engine.

18. The method of claim 15, further comprising:

receiving, by a second NMC of the NoC, an uncompressed datastream from the memory circuit; and outputting the uncompressed datastream from the second NMC to a second component of the NoC.

19. The method of claim 18, wherein the second component is a processor or an artificial intelligence engine.

20. The method of claim 15, wherein decompressing, by the first decompressor, the received compressed datastream using the plurality of symbol decoders further comprises:

decoding, by a first symbol decoder of the plurality of symbol decoders, a first symbol of the received compressed datastream; and based on an output of the first symbol decoder, selecting an output of another one of the plurality of symbol decoders to decode a second symbol of the received compressed datastream.

* * * * *